(12) United States Patent
Heinila (10) Patent No.: US 6,732,327 B1
(45) Date of Patent: May 4, 2004

(54) SCALED-FEEDBACK TURBO DECODER

(75) Inventor: Marko Heinila, Helsinki (FI)

(73) Assignee: Nokia Networks Oy, Espoo (FI)

( * ) Notice: Subject to any disclaimer, the term of this patent is extended or adjusted under 35 U.S.C. 154(b) by 0 days.

(21) Appl. No.: 09/565,502

(22) Filed: May 5, 2000

(51) Int. Cl.$^7$ ............................................. H03M 13/03
(52) U.S. Cl. ...................................... 714/792; 714/786
(58) Field of Search ................................ 714/796, 776, 714/792, 753, 756, 746, 755, 786; 370/342, 331; 375/147

(56) References Cited

U.S. PATENT DOCUMENTS

| | | | |
|---|---|---|---|
| 5,406,570 A | 4/1995 | Berrou et al. .................. | 371/43 |
| 5,446,747 A | 8/1995 | Berrou .......................... | 371/45 |
| 5,563,897 A | 10/1996 | Pyndiah et al. ............. | 371/37.4 |
| 5,970,085 A | * 10/1999 | Yi ................................ | 370/342 |
| 5,978,365 A | * 11/1999 | Yi ................................ | 370/331 |
| 6,145,114 A | 11/2000 | Crozier et al. ............... | 714/794 |
| 6,304,996 B1 | * 10/2001 | Van Stralen et al. ........ | 714/796 |

FOREIGN PATENT DOCUMENTS

| | | | |
|---|---|---|---|
| EP | 0 963 048 A2 | 8/1999 | .......... H03M/13/00 |

OTHER PUBLICATIONS

IEEE Transactions On Communications, vol. 44, No. 10 Oct., 1996; Near Optimum Error Correcting coding and Decoding: Turbo–Codes.

Near Shannon Limit Error–Correcting Coding And Decoding: /Turbo–Codes (1).

IEEE Journal On Selected Areas In Communications, vol. 16, No. 2, Feb., 1998; An Intuitive Justification And a Simplified Implementation Of The MAP Decoder For Convolutional Codes; Andrew J. Viterbi, Life Fellow, IEEE.

Vogt J. et al.: "Improving the max–log–MAP turbo decorder" Electronics Letters, Nov. 9, 2000, IEEE, UK, vol. 36, No. 23, pp. 1937–1939, XP000994694, ISSN: 0013–5194.

Robertson P et al.: "Optimal and sub-optimal maximum a posteriori algorithms suitable for turbo decoding" European Transactions on Telecommunications, Mar.–Apr. 1997 AEI, Italy, vol. 8, No. 2, pp. 119–125, XP000687105 ISSN: 1120–3862.

Viterbi A J: "An Intuitive Justification and a Simplified Implementation of the Map Decoder For Convolutional codes" IEEE Journal on Selected Areas in Communications, US, IEEE Inc. New York, vol. 16, No. 2, Feb. 1, 1998, pp. 260–264, XP000741780, ISSN 0733–8716.

Z. Blazek et al., "A DSP–Based Implementation of a Turbo–Decoder", IEEE, 1998, pp. 2751–2752, XP–000801545.

\* cited by examiner

*Primary Examiner*—Albert Decady
*Assistant Examiner*—Mujtaba Chaudry
(74) *Attorney, Agent, or Firm*—Cohen, Pontani, Lieberman & Pavane (57) ABSTRACT

An iterative Turbo decoder in which soft bits of a received signal are repetitively subjected to the process of decoding by a first decoder associated with a first encoder in the transmitter, interleaving by an interleaver associated with an interleaver in the transmitter, decoding by a second decoder associated with a second encoder in the transmitter, and deinterleaving by a deinterleaver associated with the interleaver in the transmitter. The improvement is to scale the signal after each decoding by a predetermined value in the vicinity of 0.7 to 0.8. At a signal Eb/No in the vicinity of 1.0 db., an improvement of about 0.2 db. in coding gain is attained while very little complexity is added. Decoders may be according to the max Log MAP algorithm instead of the more complex Log MAP algorithm with only slight degradation of performance.

12 Claims, 10 Drawing Sheets

SCALED-FEEDBACK TURBO DECODER

BACKGROUND OF THE INVENTION

1. Field of the Invention

The present invention relates to Turbo decoding of digital data transmission received over a noisy channel, and particularly to use of scaled feedback in Turbo decoding.

2. Description of the Related Art

The paper "A Mathematical Theory of Communication" (C. E. Shannon, *Bell System Technical Journal*, 27:349–423, 623–656, October, 1948) set forth "The Noisy Channel Coding Theorem", which stated that so long as the rate at which information is transmitted over a channel is less than the channel capacity, there exist error control codes that can provide arbitrarily high levels of reliability at the receiver output. However, the paper did not provide any actual coding methods for achieving arbitrarily high reliability.

The effectiveness of a code is usually expressed in terms of coding gain; i.e., the difference between the Eb/No (energy per bit over noise, a signal-to-noise ratio) required to achieve a given BER (bit error rate) in the coded system and the Eb/No required to achieve the same BER without benefit of coding.

Improvements in coding gain were made slowly. An early factor was the introduction of Golay code in the early 1950's, followed by some NASA-inspired uses of Reed-Solomon Code and Viterbi Code in the 1980's. Some of these implementations required very complex hardware, and yet, forty-five years after the publication of Shannon's paper, a gap of almost 2 db. continued to separate the performance of the most advanced error-control systems from the theoretical limit (the "Shannon limit").

A new coding method was announced in the paper "Near-Shannon-Limit Error-Correcting Coding and Decoding: Turbo Codes" (C. Berrou, A. Glavieux, and P. Thitmajshima, *Proceedings of the* 1993 *International Conference on Cominunications*, pages 1064–1070, 1993). (See generally *Turbo Coding*, Heegard and Wicker, Kluwer Academic Publishers, Norwell, Mass., 1999, ISBN 0-7923-8378-8.)

Although Turbo Codes have effected significant advances in coding gain, additional advances, closing even further the gap with the Shannon limit, are still desirable. In space communication, for example, transmitter power is inherently limited; in terrestrial wireless communication, a steep increase in the kinds of services available and in the demand for them is making bandwidth scarce. It has been estimated in the Deep Space Project that one db. of coding gain is worth eighty million dollars in spacecraft equipment costs (*Turbo Coding* at page 5).

SUMMARY OF THE INVENTION

The Turbo decoder of the present invention has improved coding gain over the prior-art Turbo decoders.

The invention is an improvement to iterative Turbo decoders of the prior art. In a prior-art Turbo decoder, a Turbo-coded signal is repetitively subjected to the process of decoding in a first decoder, interleaving, decoding in a second decoder, and deinterleaving. The improvement of the present invention is to scale the signal after each decoding step by a predetermined value. Predetermined values in the vicinity of 0.7 to 0.8 are found to improve coding gain.

Other objects and features of the present invention will become apparent from the following detailed description considered in conjunction with the accompanying drawings. It is to be understood, however, that the drawings are designed solely for purposes of illustration and not as a definition of the limits of the invention, for which reference should be made to the appended claims. It should be further understood that the drawings are not necessarily drawn to scale and that, unless otherwise indicated, they are merely intended to conceptually illustrate the structures and procedures described herein.

BRIEF DESCRIPTION OF THE DRAWINGS

In the drawings, wherein like reference numerals denote similar elements.

DETAILED DESCRIPTION OF THE PRESENTLY PREFERRED EMBODIMENTS

In communications conducted under difficult conditions, such as, for example, in space communication where a transmitter is inherently limited to low power and must transmit over vast distances and under conditions in which noise is likely to be received along with signal, it is routinely necessary to extract intelligence from signals that may be a mere fraction of a decibel above the noise level. Means of reducing error rates have been developed, including Turbo coding.

Figure 1:
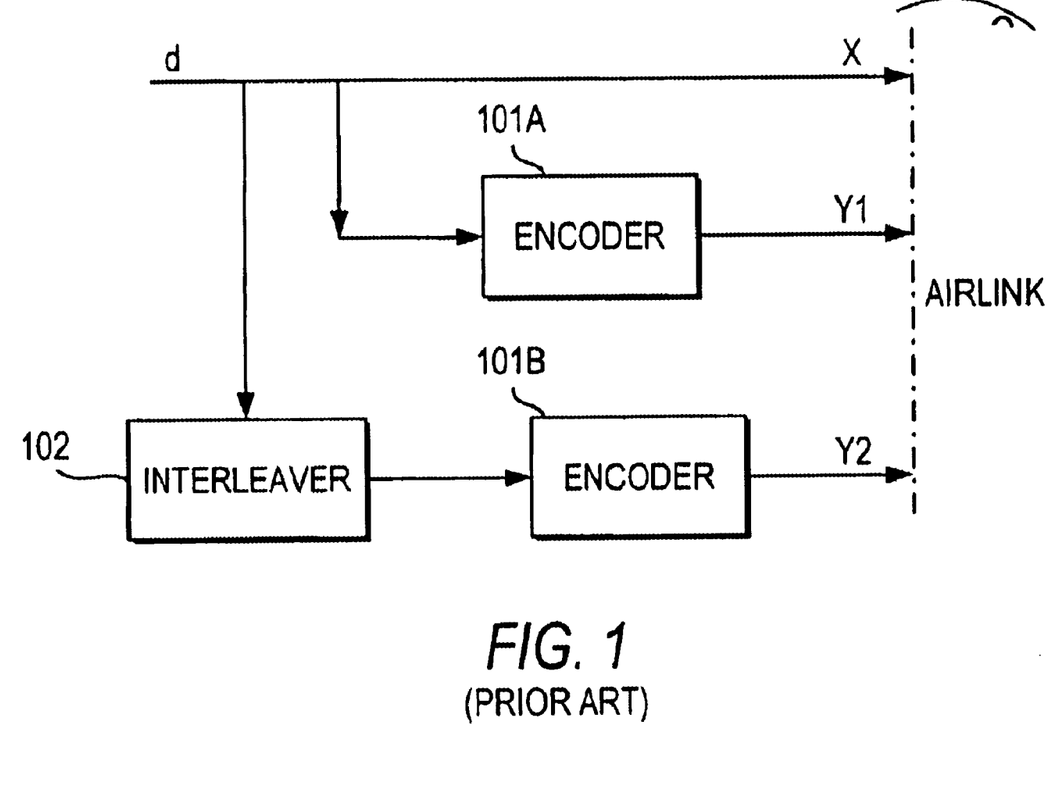
FIG. 1 is a block diagram of a prior-art Turbo encoder used in a transmitting station.

FIG. 1 is a block diagram of a Turbo encoder known in the art for encoding a datastream d to be transmitted via an airlink. The datastream d is encoded by constituent encoder 101A to produce coded stream Y1. The datastream d is also interleaved by interleaver 102 and then encoded by constituent encoder 101B to produce coded stream Y2. Multiplexed in the transmitted output are the datastreams X (a feedthrough of datastream d), Y1, and Y2. Since three streams are transmitted on the airlink to represent the one datastream d, the arrangement of FIG. 1 is said to have a code ratio R =⅓.

Although, in principle, it is possible to derive the optimal decoder for any given Turbo encoder, the result would be an extremely expensive and computationally inefficient system. In practical systems, therefore, iterative decoding is generally employed. Turbo decoding is typically an iterative application of the Generalized Viterbi Algorithm to successively generate an improved detection of the transmitted data. The two-encoder structure shown in FIG. 1 suggests a decoding strategy based on the iterative passing of soft decoding information between two decoding algorithms.

Figure 2:
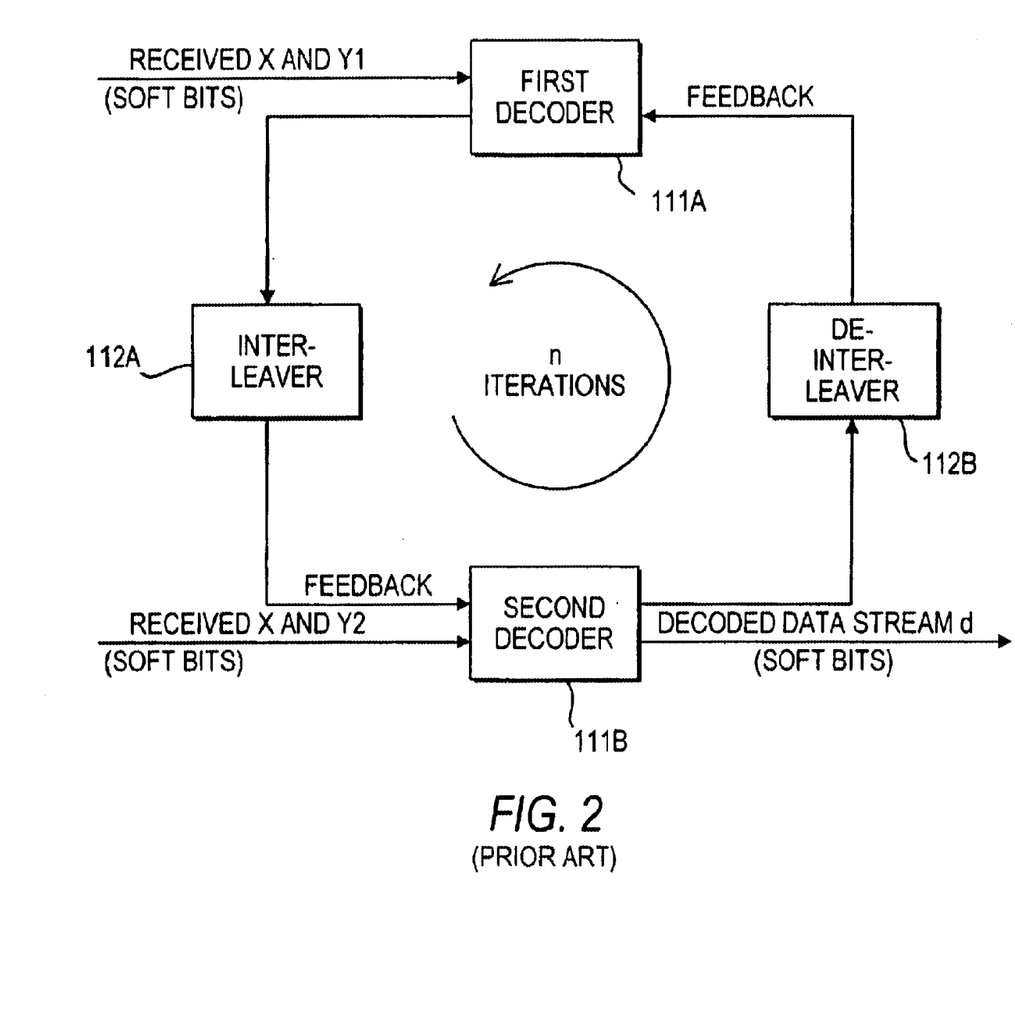
FIG. 2 illustrates the form of a prior-art Turbo decoder to be used in a corresponding receiving station.

The form of a suitable Turbo decoder is given in FIG. 2. Each decoder in FIG. 2 is associated with one of the encoders in FIG. 1, and through successive computations the two decoders arrive at a consensus on the detection of the transmitted data. The characteristics of first decoder 111A are determined according to the characteristics of encoder 101A at the transmitter (FIG. 1). The characteristics of second decoder 111B are determined according to the characteristics of encoder 101B at the transmitter. The characteristics of interleaver 112A and deinterleaver 112B are determined according to the characteristics of interleaver 102 at the transmitter.

Portions of a receiver not shown in FIG. 2 receive the X, Y1, and Y2 streams over the airlink. As is known in the art, the receiver receives a combination of the transmitted hard bits and noise, and by sampling the received data stream the receiver receives, in effect, "soft bits". Hard polar bits are constrained to values of 1 or −1, which correspond to binary data bits of 0 and 1 respectively. Corresponding soft bits are numbers expressing relative probabilities of hard bits being 1 or −1 respectively. For example, a soft bit may be a six-bit number. A six-bit signed number can represent values from −32 to 31; −32 might represent the strongest probability that the corresponding hard bit has a value of −1, while 31 might represent the strongest probability that the corresponding hard bit has value of 1.

Each frame of X, Y1, and Y2 soft bits is input to the Turbo decoder of FIG. 2, and are run through a number of iterations. A predetermined number n may be imposed as a limit. Iteration may be discontinued after fewer than n iterations if it is seen that the data do not change in an iteration. In each iteration, first decoder 111A which is determined according to encoder 101A at the transmitter (FIG. 1) processes the stream of soft bits. The stream is then interleaved by interleaver 112A which is determined according to interleaver 102 of FIG. 1, and the steam is then decoded by decoder 111B which is determined according to encoder 101B of FIG. 1. In preparation for the next iteration, the stream is deinterleaved by deinterleaver 112B, also determined according to interleaver 102 at the transmitter (FIG. 1).

Since the output X of the Turbo encoder at the transmitter was a feed-through of the original data stream d, the X soft bits output from second decoder 111B reflect the data stream d. After the predetermined number of iterations has taken place, the X soft bits are taken from decoder 111B and are used as the received version of the transmitted data stream d.

Iterative decoding following the form presented in FIG. 2 can be realized with a single processor that performs all computations, or with a pipelined architecture that allows data to flow through a series of discrete computational engines. A great number of embodiments are possible for each type; an exemplary embodiment of each will be given.

Figure 3:
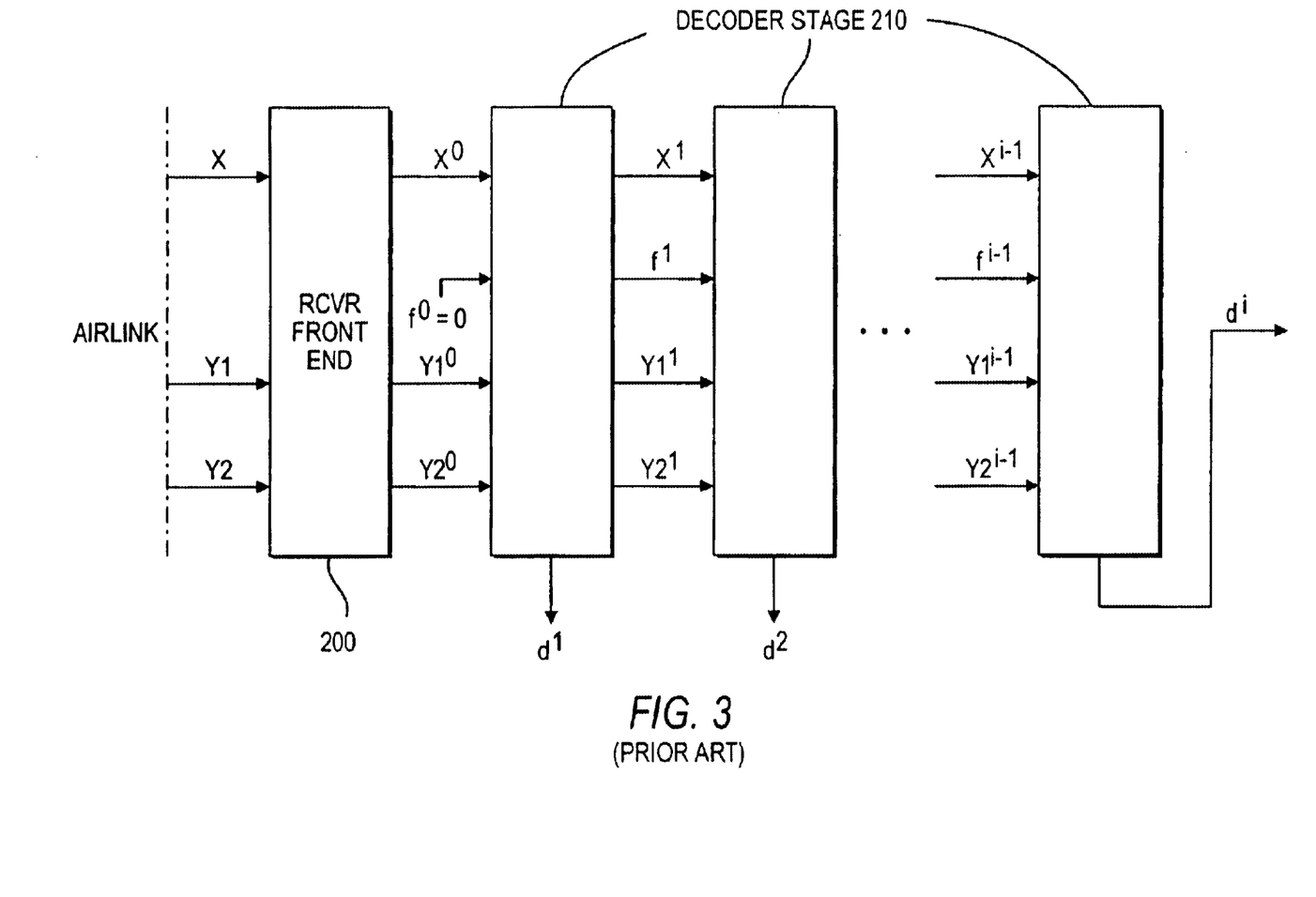
FIG. 3 is a high-level block diagram of a pipelined prior-art Turbo decoder following the form given in FIG. 2.

FIG. 3 is a high-level block diagram of portions of a receiver including a decoding arrangement of the pipelined type. The signal is decoded iteratively, with each iteration reducing the error rate. The streams X, Y1 and Y2 (as produced at the transmitter by an arrangement such as that of FIG. 1) are received from the airlink by receiver front end 200 and input to the iterative decoder of FIG. 3, which is depicted as containing an arbitrary number i of decoder stages 210. Each decoder stage 210 accomplishes one iteration of the n iterations specified in the form given in FIG. 2.

The soft bits from receiver front end 200 corresponding to X, Y1 and Y2 are input to the first decoder stage 210 and are connoted $X^0$, $Y1^0$, and $Y2^0$. Each decoder stage 210 also has a feedback input f, the feedback input to the first stage being connoted $f^0$ and being forced to a value of 0.

Each decoder stage 210 has X, Y1, Y2, and f outputs; each also has a d output, which is determined from X and is taken to be the decoded value from the datastream d which is to be detected. (If the X soft bits are positive, d is taken to be +1; if negative, d is taken to be −1.) For all stages prior to the i'th stage, the X, Y1, Y2, and f outputs are input to the next stage while the d output is not used. At the i'th stage, the d output is used for the output data stream while the X, Y1, Y2, and f outputs are not used.

Figure 4:
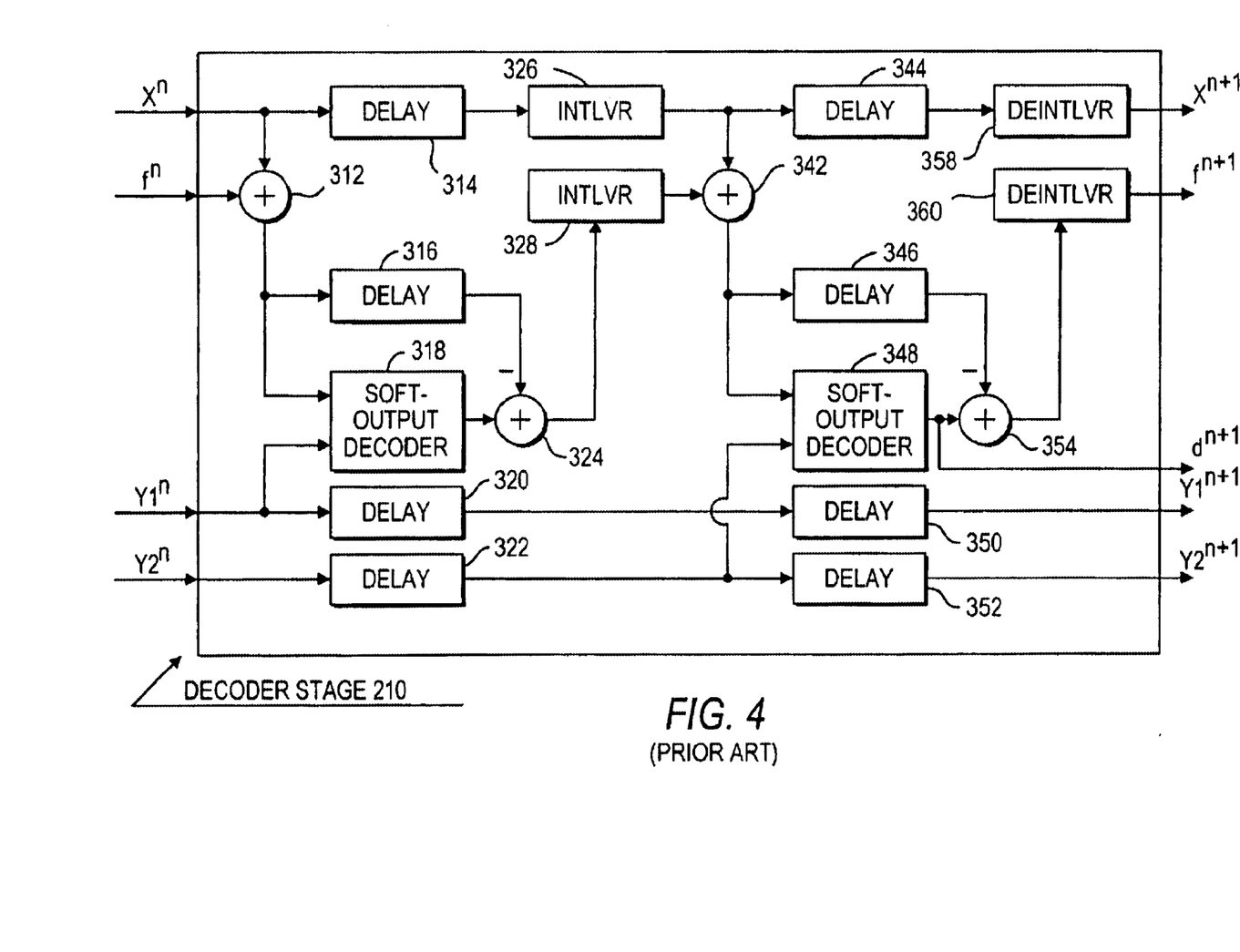
FIG. 4 is a block diagram showing detail of one of the decoder stages comprising the prior-art pipelined decoder of FIG. 3.

FIG. 4 is a block diagram of a possible implementation of a decoder stage 210, as known to those in the art. The various delays (314, 316, 320, 322, 344, 346, 350, 352) are necessary to maintain proper timing relationships as the streams of binary bits which in turn comprise the streams of soft bits pass through decoder stage 210. Soft output decoder 318 corresponds to first decoder 111A of FIG. 2. Interleavers 326 and 328, along with summer 342, collectively correspond to interleaver 112A of FIG. 2. Delay 316 introduces the same amount of delay as soft decoder 318, so that summer 324 calculates the difference between the input and output of decoder 318, which difference, after interleaving by interleaver 328 is added to the X signal for input to soft output decoder 348 in order to provide the feedback signal at that point. Soft output decoder 348 corresponds to second decoder 111B of FIG. 2. Deinterleavers 358 and 360, along with summer 312 of the next decoder stage 210, collectively correspond to deinterleaver 112b of FIG. 2. Delay 346 functions analogously to delay 316; summer 354 functions analogously to summer 324. As is known in the art, decoders 318 and 348 operate according to the Log maximum a posteriori (Log MAP) algorithm (see, generally, "An Intuitive Justification and a Simplified Implementation of the MAP Decoder for Convolutional Codes", Andrew J. Viterbi, *IEEE Journal on Selected Areas in Communications*, Vol. 16, No. 2, February 1998).

Figure 5:
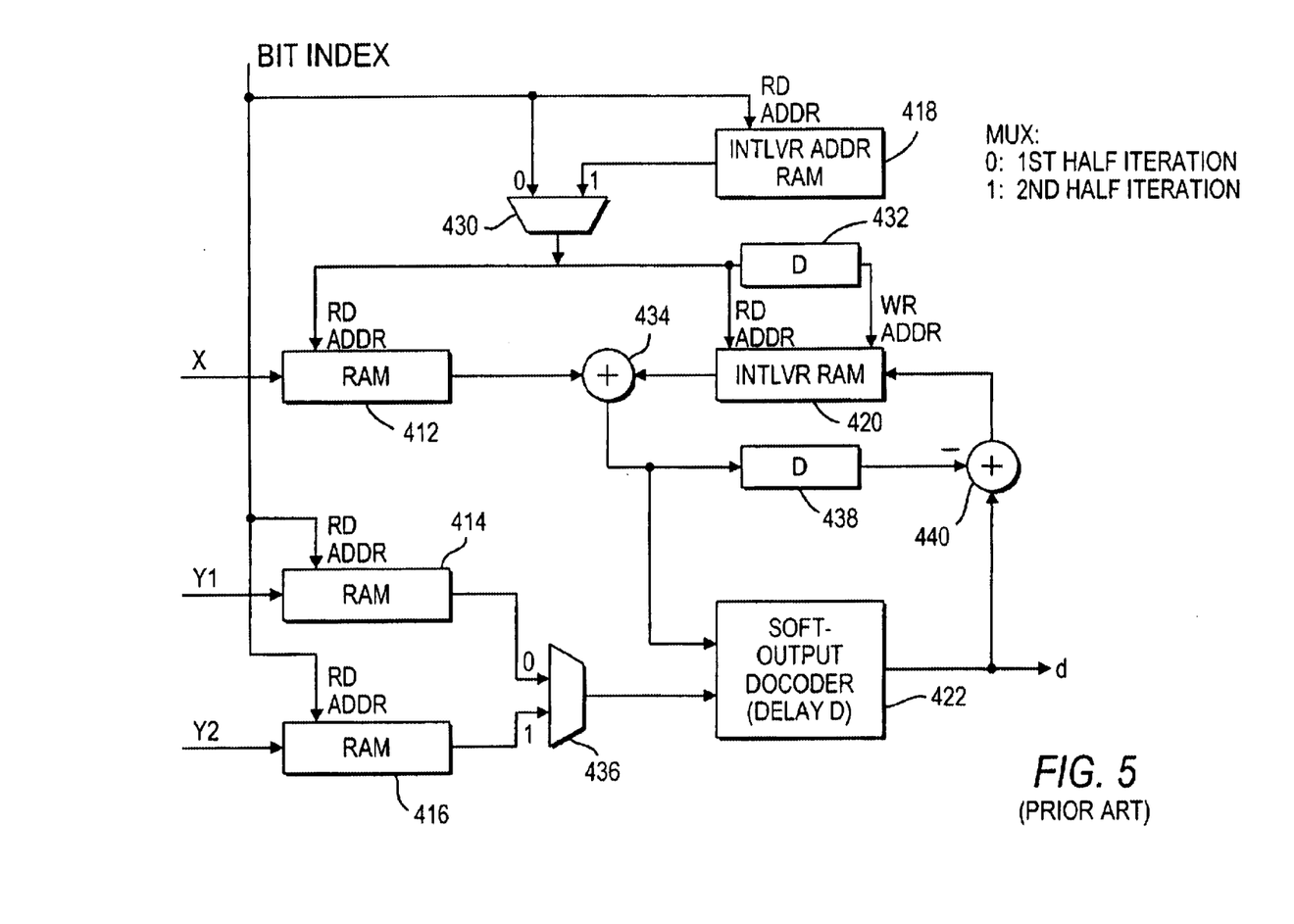
FIG. 5 is a block diagram of a prior-art single-processor decoder following the form given in FIG. 2.

FIG. 5 is a block diagram of a possible embodiment of the single-processor type of Turbo decoder. The soft bit streams derived from the received hard bit streams X, Y1, and Y2 are input to RAMs 412, 414, 416. Delays 432 and 438 maintain timing relationships among the bits comprising the bit stream. Soft output decoder 422 is used repetitively, storing its intermediate results in random-access memory (RAM) 420 after each use. RAM 420 can have the effect of interleaving and deinterleaving its contents according to an appropriate sequence of write address inputs for storing and a different appropriate sequence of read address inputs for readout. The sequences are provided under control of software or firmware (not shown). Also under control of software or firmware, multiplexer 430 selects appropriate addresses from the bit index input or RAM 418, and multiplexer 436 selects data from one of RAMS 414 and 416 so as to control decoder 422 and interleaver RAM 420 to behave in the first half iteration as decoder 111A and interleaver 112A of FIG. 2, and in the second half iteration as decoder 111B and deinterleaver 112B of FIG. 2. Delay 438 introduces the same delay as decoder 422 so that summer 440 calculates the difference between,an input and output of decoder 422, which difference is fed back through interleaver RAM 420 to summer 434. As is known in the art, decoder 422 operates according to the Log MAP algorithm.

The single-processor type of Turbo decoder requires less hardware than the pipelined type by virtue of storing intermediate results in RAMs and achieving successive iterations by repetitively reusing the same hardware, under the control of software or firmware. For example, where the pipelined embodiment of FIG. 4 requires two soft decoders (318 and 348) times the number of iterations, the single-processor embodiment of FIG. 5 requires only one soft decoder (422) regardless of the number of iterations performed. The single-processor embodiment of FIG. 5 is thus preferable for incorporation in an application-specific integrated circuit (ASIC).

Figure 6:
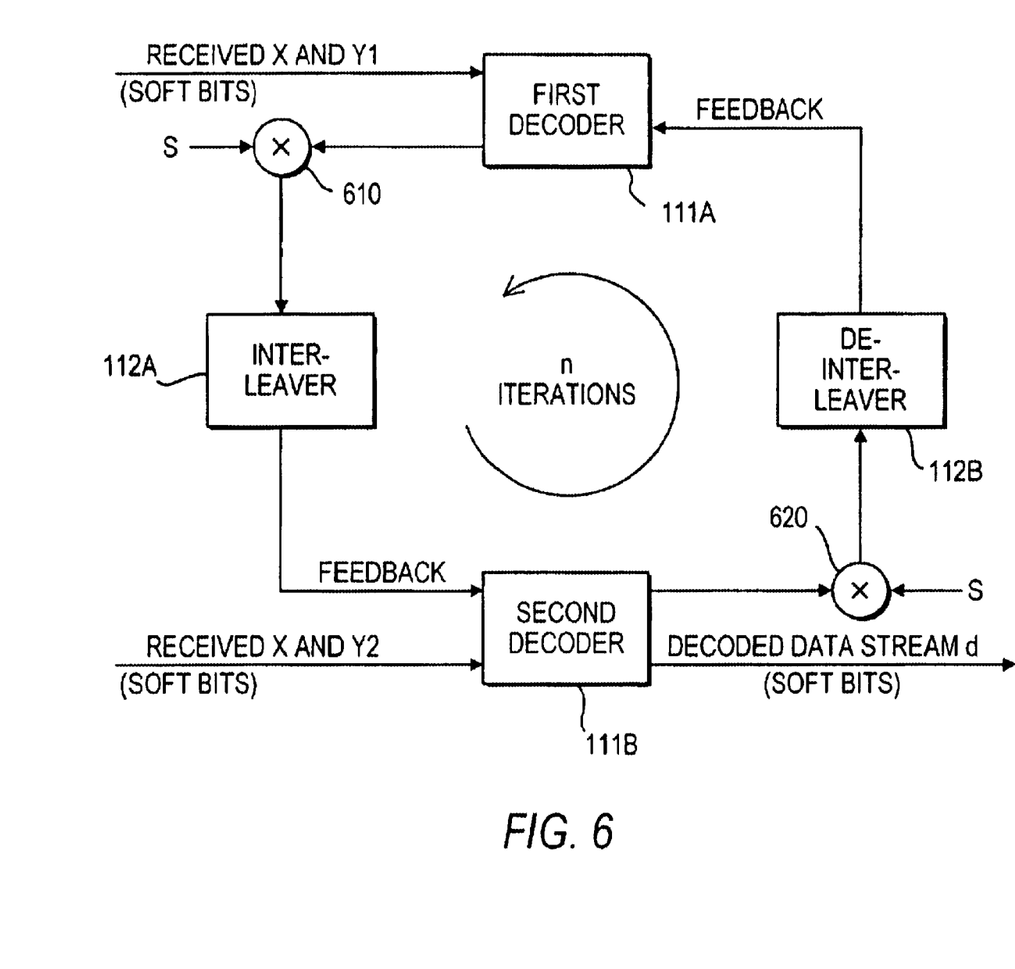
FIG. 6 illustrates the form of a Turbo decoder as given in FIG. 2 and further incorporating the present invention.

FIG. 6 depicts the form of a Turbo decoder incorporating feedback scaling according to the present invention. Coding gain is improved by scaling the feedback in a Turbo decoder. The difference shown in FIG. 6 over the corresponding FIG. 2 of the prior art is the addition of multipliers 610 and 620, which scale each soft-bit number at the decoder outputs by the scaling factor S (the same value of S on both multipliers). Positive results are obtained with values of S that are less than 1. Best results have been obtained with values of S in the vicinity of 0.7 to 0.8.

The numbers being scaled are soft bits, which represent the relative probability of the corresponding hard bit being a −1 or a +1 according to the polarity of the soft bit. Scaling a soft bit's value does not preclude the possibility of its being readjusted the next iteration. Thus scaling a soft bit down in value (as is taught in the present invention) does not force it to converge to zero; scaling a soft bit up in value does not force it to an overflow condition.

Figure 7:
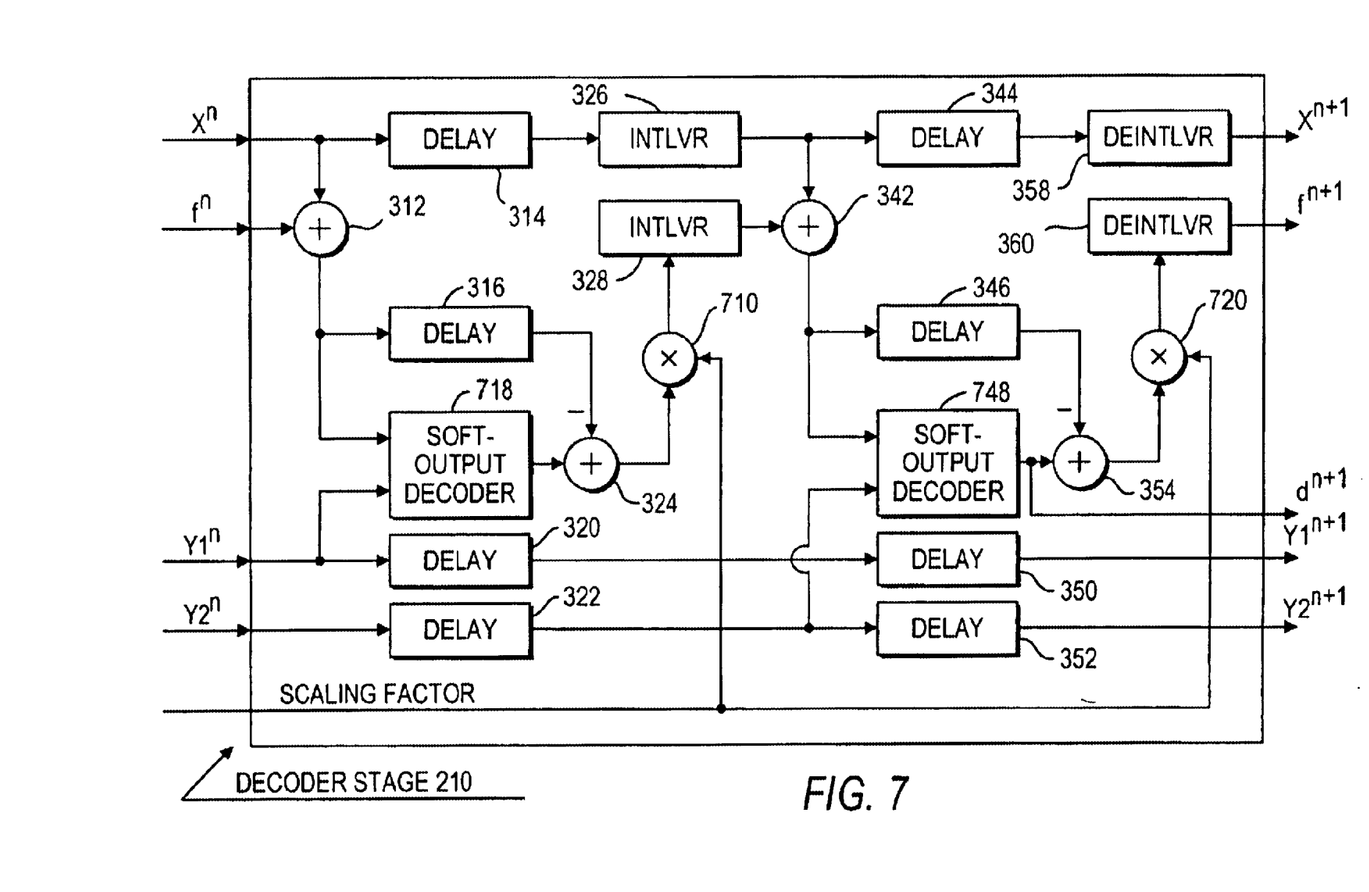
FIG. 7 is a block diagram of a decoder stage as in FIG. 4 but incorporating the present invention.

FIG. 7 corresponds to the pipelined decoder embodiment of FIG. 4, but as improved by the present invention. Multipliers 710 and 720 are introduced for scaling the feedback signals (outputs of summers 324 and 354) by a scaling factor. Also, the present invention enables the replacement of decoders 318 and 348 (which, as noted above, employ the log MAP algorithm) with decoders 718 and 748 which employ the simpler max log MAP algorithm. Without the invention, there is a degradation in performance if the max log MAP algorithm is used in place of the log MAP algorithm; the scaling of the present invention reduces that degradation by about two thirds on a db. scale. Since the addition of multipliers to perform the scaling represents only a slight increase in complexity, the invention overall with its use of the simpler max log MAP algorithm enables a significant reduction in complexity with only a small performance change. The constraint length K used in the transmitter's encoders 110A and 102A has a bearing on the performance difference brought about by using the simpler max log MAP algorithm. Good results have been obtained with a constraint length K equal to 4 in conjunction with the present invention.

Figure 8:
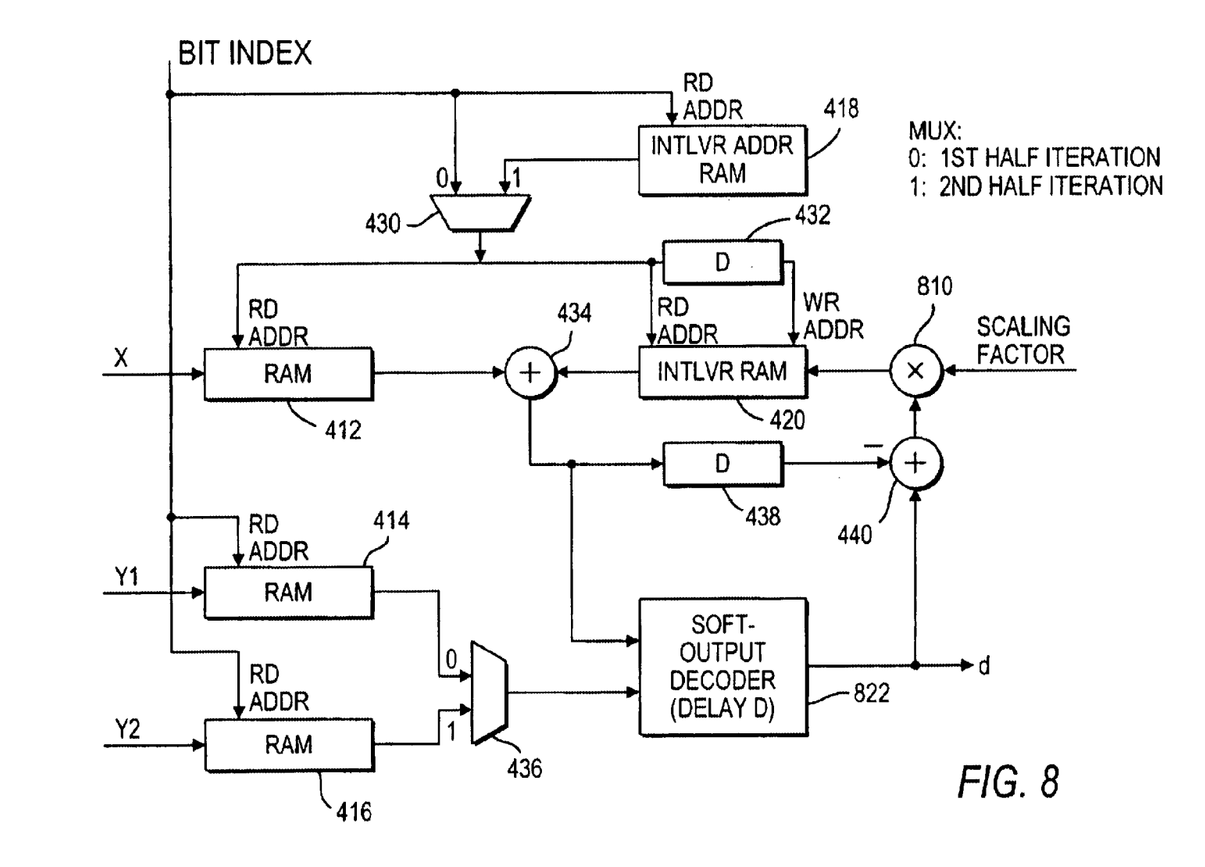
FIG. 8 is a block diagram of a single-processor decoder as in FIG. 5 but incorporating the present invention.

Similarly, FIG. 8 corresponds to the single-processor decoder embodiment of FIG. 5 as improved by the present invention. Multiplier 810 is introduced for scaling the feedback signal (output of summer 440) by a scaling factor. Decoder 422 (employing the log MAP algorithm) can now be replaced by decoder 822 which employs the simpler max log MAP algorithm. As explained above, decoder 822 functions alternatively as first decoder 111 A and second decoder 111B of FIG. 6. Accordingly, multiplier 810 functions alternatively as multipliers 610 and 620 of FIG. 6.

Figure 9:
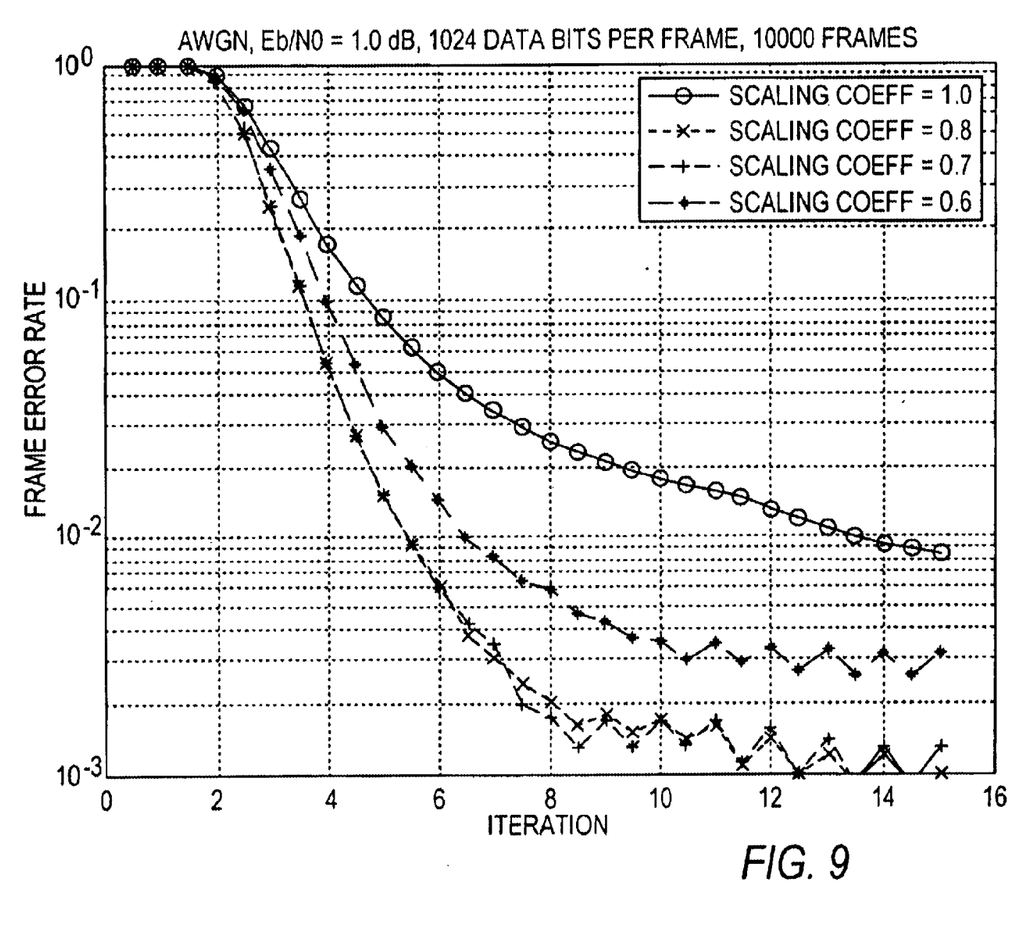
FIG. 9 is a plot of Frame Error Rate (FER) vs. number of decoding iterations for several scaling factors according to the present invention.

FIG. 9 is a plot of simulation results of Frame Error Rate vs. number of decoding iterations using the Turbo decoder of the present invention with several different scaling factors and assuming a signal with additive white Gaussian noise (AWGN), Eb/No of 1.0 db., a frame size of 1024 bits, an encoding constraint length K =4, and a transmission of 10000 frames. It is desirable to lower the frame error rate, indicating fewer errors in transmission. Scaling factors used are 1.0, 0.8, 0.7, and 0.6. (A scaling factor of 1.0 is tantamount to not using the scaling taught by the invention.) FIG. 9 shows that a FER of 0.01, for example, (meaning that one frame out of a hundred is received with an error) may be attained after 14 Turbo decoding iterations with a scaling factor of 1.0 (i.e., without using the scaling of the invention), after 7 iterations with a scaling factor of 0.6, and after 6 iterations with a scaling factor of 0.7 or 0.8. Thus, the present invention provides a reduction from 14 iterations to 6 to achieve a particular FER. This enables a substantial increase in speed if a single-processor Turbo decoder is used, and a substantial increase in speed and a substantial reduction in hardware if a pipelined Turbo decoder is used.

Figure 10:
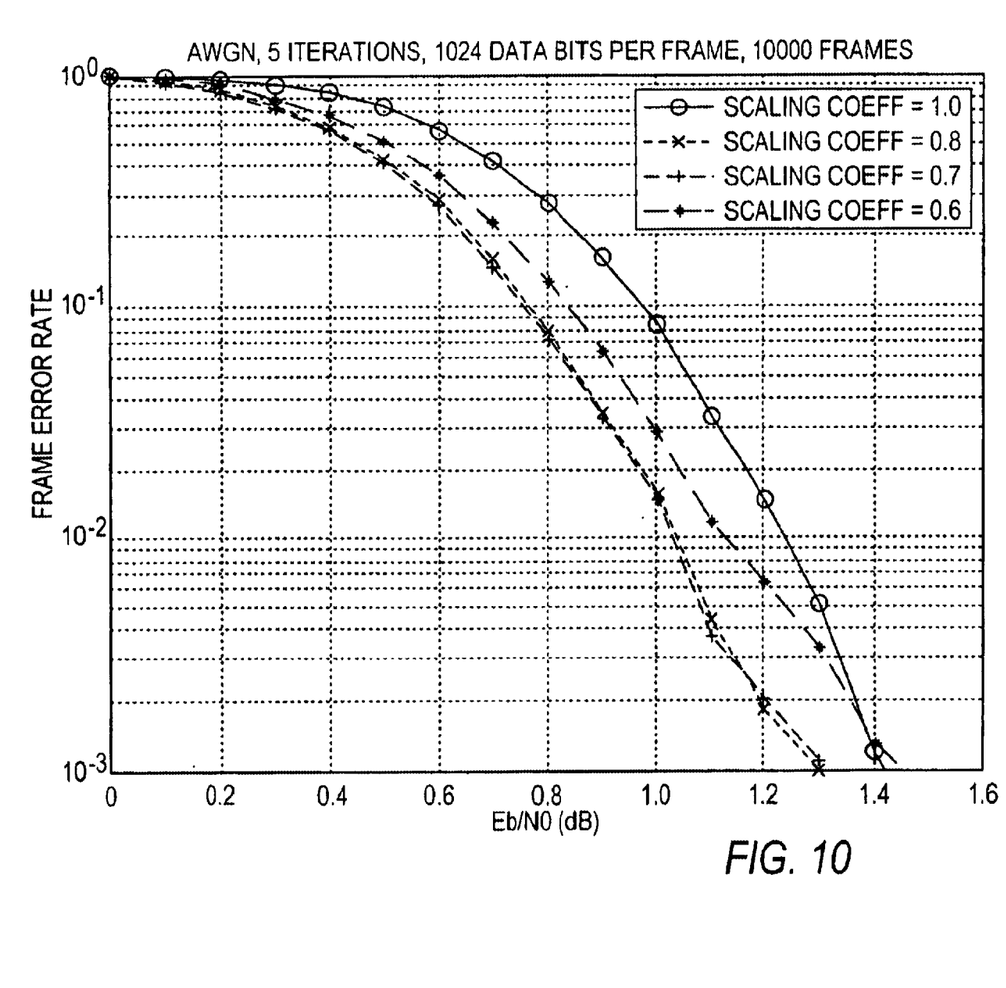
FIG. 10 is a plot of FER vs. Eb/No for several scaling factors according to the present invention.

FIG. 10 is a plot of simulation results of FER vs. Eb/No using the present invention with several different scaling factors and assuming a signal with AWGN, 5 iterations of decoding, a frame size of 1024 bits, an encoding constraint length K =4, and transmission of 10000 frames. FIG. 10 indicates that to achieve an FER of 0.01, for example, requires an Eb/No of about 1.25 db. with a scaling factor of 1.0 (i.e., without using the scaling taught by the invention), about 1.13 db. with a scaling factor of 0.6, and about 1.05 db with a scaling factor of 0.7 or 0.8. The coding gain effected by the invention with scaling factors of 0.7 or 0.8 is thus 1.25 db. −1.05 db., or 0.2 db.

Thus, the present invention reduces circuit complexity by allowing the use of Turbo decoders employing the max Log MAP algorithm without serious degradation of coding gain over decoders using the more complicated Log MAP algorithm.

Thus, while there have been shown and described and pointed out fundamental novel features of the invention as applied to a preferred embodiment thereof, it will be understood that various omissions and substitutions and changes in the form and details of the devices illustrated, and in their operation, may be made by those skilled in the art without departing from the spirit of the invention. For example, it is expressly intended that all combinations of those elements and/or method steps which perform substantially the same function in substantially the same way to achieve the same results are within the scope of the invention. Moreover, it should be recognized that structures and/or elements and/or method steps shown and/or described in connection with any disclosed form or embodiment of the invention may be incorporated in any other disclosed or described or suggested form or embodiment as a general matter of design choice. It is the intention, therefore, to be limited only as indicated by the scope of the claims appended hereto.

I claim:

1. A method of iteratively decoding a Turbo-coded frame comprising the steps of:

(a) setting a first feedback value to zero;

(b) decoding X and Y1 elements of the frame and the first feedback value in a first decoder determined according to a first encoder at a transmitter of the signal;

(c) calculating a first difference between output of the first decoder and a sum of the first feedback value and X element of the frame;

(d) scaling the first difference by a predetermined value;

(e) interleaving the scaled first difference in an interleaver determined according to an interleaver at the transmitter to produce a second feedback value;

(f) decoding X and Y2 elements of the frame and the second feedback value in a second decoder determined according to a second encoder at the transmitter;

(g) calculating a second difference between output of the second decoder and a sum of the second feedback value and X element of the frame;

(h) scaling the second difference by the predetermined value;

(i) deinterleaving output of the second decoder in a deinterleaver determined according to the interleaver at the transmitter to produce the first feedback value;

(j) repeating steps (b) through (i) a predetermined number of times; and (k) after repeating steps (b) through (i) the predetermined number of times, outputting decoded frame data from the second decoder.

2. The method of claim 1, wherein the predetermined value is less than 1.

3. The method of claim 1, wherein the predetermined value is between 0.65 and 0.85.

4. The method of claim 1, wherein the first decoder and the second decoder function according to the max log MAP algorithm.

5. A Turbo decoder for decoding elements of a Turbo-coded frame, comprising:

setting means for setting a first feedback value to zero;

first decoding means for decoding X and Y1 elements of the frame and the first feedback value according to a first encoder at a transmitter of the signal;

arithmetic means for calculating a first difference between output of the first decoding means and a sum of the first feedback value and X element of the frame;

scaling means for scaling the first difference by a predetermined value;

interleaving means for interleaving the scaled output of the first decoding means according to an interleaver at the transmitter for producing a second feedback value;

second decoding means for decoding X and Y2 elements of the frame and the second feedback value according to a second encoder at the transmitter;

arithmetic means for calculating a second difference between output of the second decoder and a sum of the second feedback value and X element of the frame;

scaling means for scaling the second difference by a predetermined value;

deinterleaving means for deinterleaving the second difference according to the interleaver at the transmitter to produce the first feedback value;

means for initiating a subsequent iteration by feeding the first feedback value back to the first decoder; and means for outputting decoded frame data from the second decoder after a predetermined number of iterations.

6. The Turbo decoder of claim 5, wherein the predetermined value is less than 1.

7. The Turbo decoder of claim 5, wherein the predetermined value is between 0.65 and 0.85.

8. The Turbo decoder of claim 5, wherein the first decoder and the second decoder function according to the max log MAP algorithm.

9. A Turbo decoder for decoding elements of a Turbo-coded frame, comprising:

a circuit for setting a first feedback value to zero;

a first decoder arranged to decode X and Y1 elements of the frame and the first feedback value according to a first encoder at a transmitter of the signal;

an arithmetic unit arranged to calculate a first difference between output of the first decoder and a sum of the first feedback value and X element of the frame;

a multiplier arranged to scale the first difference by a predetermined value;

an interleaver arranged to interleave the scaled first difference according to an interleaver at the transmitter for producing a second feedback value;

a second decoder arranged to decode X and Y2 elements of the frame and the second feedback value according to a second encoder at the transmitter;

an arithmetic unit arranged to calculate a second difference between output of the second decoder and a sum of the second feedback value and X element of the frame;

a multiplier arranged to scale the second difference by a predetermined value;

a deinterleaver arranged to deinterleave the scaled second difference according to the interleaver at the transmitter to produce the first feedback value;

a feedback circuit arranged to initiate a subsequent iteration by feeding the first feedback value back to the first decoder; and an output circuit arranged to output decoded frame data from the second decoder after a predetermined number of iterations.

10. The Turbo decoder of claim 9, wherein the predetermined value is less than 1.

11. The Turbo decoder of claim 9, wherein the predetermined value is between 0.65 and 0.85.

12. The Turbo decoder of claim 9, wherein the first decoder and the second decoder function according to the max log MAP algorithm.

\* \* \* \* \*